United States Patent
Lee et al.

(10) Patent No.: US 9,871,228 B2
(45) Date of Patent: Jan. 16, 2018

(54) ORGANIC LIGHT EMITTING DEVICE COMPRISING FLEXIBLE SUBSTRATE AND METHOD FOR PREPARING THEREOF

(71) Applicant: LG DISPLAY CO., LTD., Seoul (KR)

(72) Inventors: Jung Hyoung Lee, Daejeon (KR); Junrye Choi, Daejeon (KR); Jihee Kim, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/647,758

(22) PCT Filed: Nov. 15, 2013

(86) PCT No.: PCT/KR2013/010398
§ 371 (c)(1),
(2) Date: May 27, 2015

(87) PCT Pub. No.: WO2014/084529
PCT Pub. Date: Jun. 5, 2014

(65) Prior Publication Data
US 2015/0303408 A1    Oct. 22, 2015

(30) Foreign Application Priority Data

Nov. 30, 2012 (KR) ......................... 10-2012-0138336

(51) Int. Cl.
*H01L 51/56* (2006.01)
*H01L 51/00* (2006.01)
*H01L 51/52* (2006.01)
*B32B 7/06* (2006.01)
(Continued)

(52) U.S. Cl.
CPC ................ *H01L 51/56* (2013.01); *B32B 7/06* (2013.01); *B32B 17/064* (2013.01); *B32B 27/281* (2013.01); *H01L 51/003* (2013.01); *H01L 51/0024* (2013.01); *H01L 51/0097* (2013.01); *H01L 51/5237* (2013.01); *H01L 51/5262* (2013.01); *H01L 2251/5338* (2013.01);
(Continued)

(58) Field of Classification Search
CPC combination set(s) only.
See application file for complete search history.

(56) References Cited

U.S. PATENT DOCUMENTS

2002/0043723 A1* 4/2002 Shimizu ................ H01L 23/528
257/758
2006/0043343 A1* 3/2006 Chacko .................. B82Y 10/00
252/500

(Continued)

FOREIGN PATENT DOCUMENTS

CN          1617798 A      5/2005
CN        102629593 A      8/2012
(Continued)

*Primary Examiner* — Kyoung Lee
*Assistant Examiner* — Ratisha Mehta
(74) *Attorney, Agent, or Firm* — Dentons US LLP

(57) ABSTRACT

The present application relates to an organic light emitting device including a flexible substrate, and a preparing method thereof, and the method includes: 1) forming a polyimide layer on a carrier substrate; 2) forming a plastic substrate on the carrier substrate and the polyimide layer; 3) forming an organic light emitting device on the plastic substrate; and 4) separating the carrier substrate.

22 Claims, 3 Drawing Sheets

(51) Int. Cl.
*B32B 17/06* (2006.01)
*B32B 27/28* (2006.01)
(52) U.S. Cl.
CPC ....... *H01L 2251/558* (2013.01); *Y02E 10/549* (2013.01); *Y02P 70/521* (2015.11)

(56) References Cited

U.S. PATENT DOCUMENTS

| | | | |
|---|---|---|---|
| 2007/0152210 A1* | 7/2007 | Han | H01L 51/0533 257/40 |
| 2008/0053604 A1 | 3/2008 | Kim et al. | |
| 2008/0292786 A1 | 11/2008 | Hatano et al. | |
| 2009/0079038 A1* | 3/2009 | Schneegans | H01L 21/78 257/620 |
| 2009/0261062 A1* | 10/2009 | Kim | B32B 7/12 216/24 |
| 2010/0143708 A1 | 6/2010 | Liao et al. | |
| 2010/0264112 A1 | 10/2010 | Jiang et al. | |
| 2010/0267203 A1 | 10/2010 | Chen et al. | |
| 2011/0003442 A1 | 1/2011 | Wang et al. | |
| 2011/0059397 A1* | 3/2011 | Seong | G03F 7/0233 430/270.1 |
| 2011/0228492 A1* | 9/2011 | Haq | H05K 1/0271 361/750 |
| 2011/0266577 A1* | 11/2011 | Kim | H01L 51/5271 257/98 |
| 2011/0291544 A1 | 12/2011 | Wei et al. | |
| 2012/0052314 A1 | 3/2012 | Asthana et al. | |
| 2012/0183690 A1* | 7/2012 | Titulaer | B82Y 10/00 427/256 |
| 2012/0194065 A1* | 8/2012 | Aoki | H01L 51/5268 313/504 |
| 2012/0228617 A1* | 9/2012 | Ko | H01L 51/0097 257/59 |
| 2013/0115426 A1* | 5/2013 | Fang | H01L 27/1266 428/156 |
| 2014/0041800 A1 | 2/2014 | Okuyama et al. | |

FOREIGN PATENT DOCUMENTS

| | | |
|---|---|---|
| EP | 2278852 A1 | 1/2011 |
| EP | 2380732 A1 | 10/2011 |
| JP | 2008-292608 A | 12/2008 |
| JP | 2009-283155 A | 12/2009 |
| JP | 2011-142168 A | 7/2011 |
| JP | 2012-178268 A | 9/2012 |
| JP | 2012-189974 A | 10/2012 |
| JP | 2012-206382 A | 10/2012 |
| KR | 10-2003-0007571 A | 1/2003 |
| KR | 10-2008-0020024 A | 3/2008 |
| KR | 10-2011-0122250 A | 11/2011 |
| KR | 10-2012-0053601 A | 5/2012 |
| KR | 10-2012-0100274 A | 9/2012 |
| KR | 10-2012-0106659 A | 9/2012 |
| TW | 2010011427 A | 3/2010 |
| WO | 2011/133354 A2 | 10/2011 |
| WO | 2012/141248 A1 | 10/2012 |

* cited by examiner

[FIG. 1]
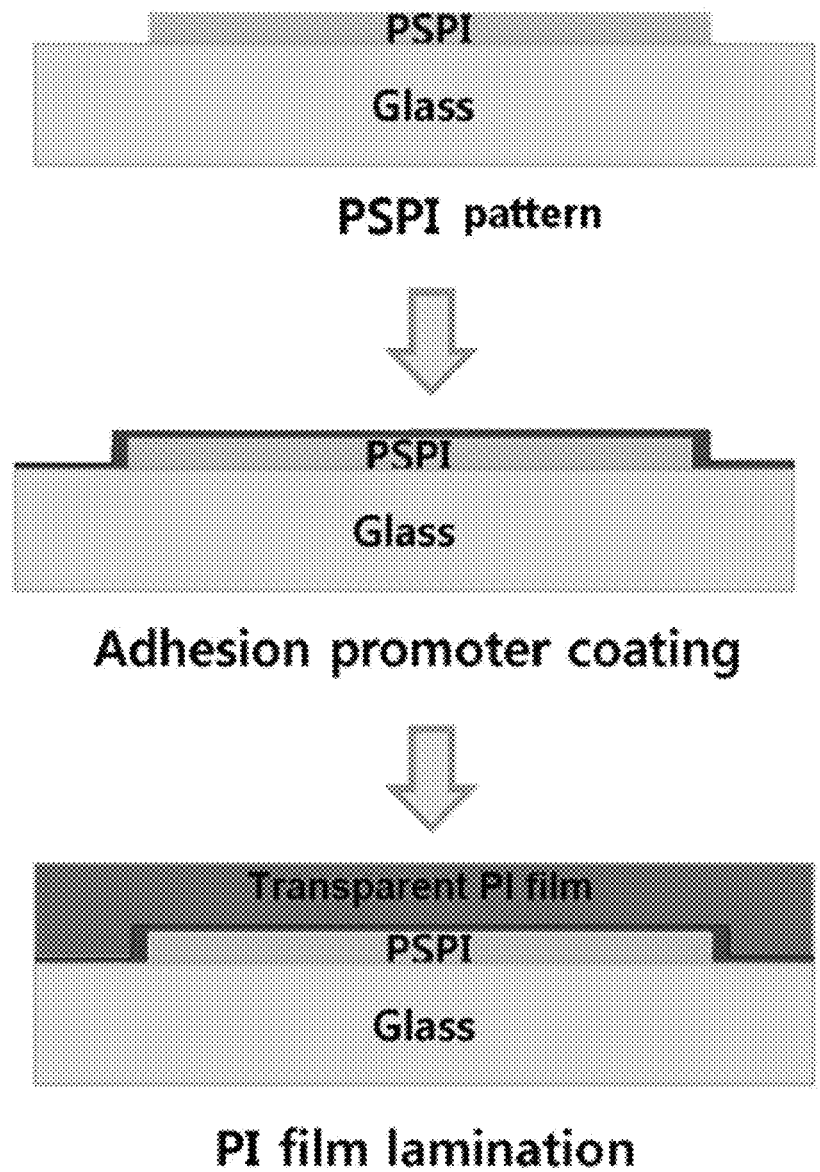

[FIG. 2]
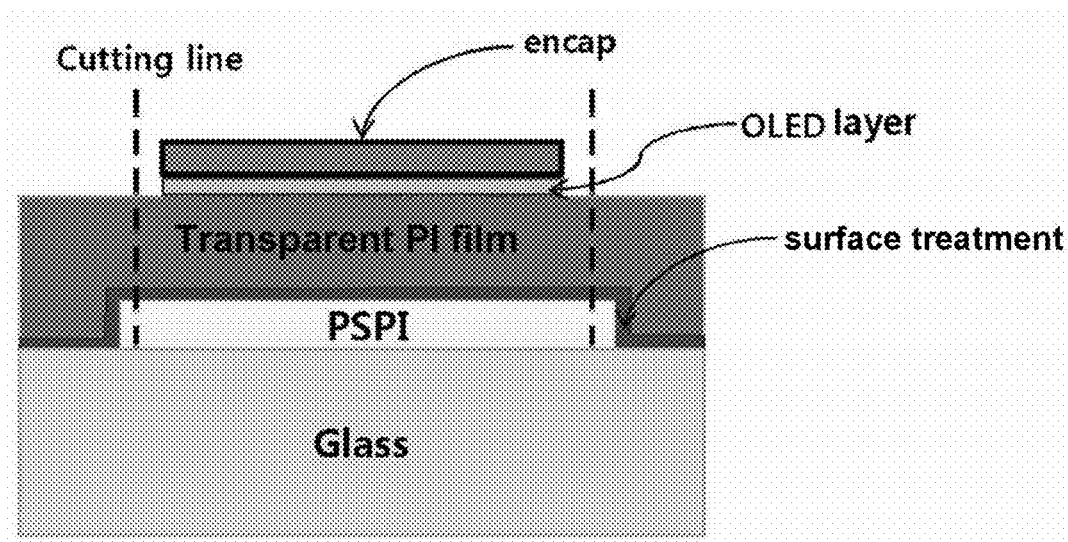

[FIG. 3]
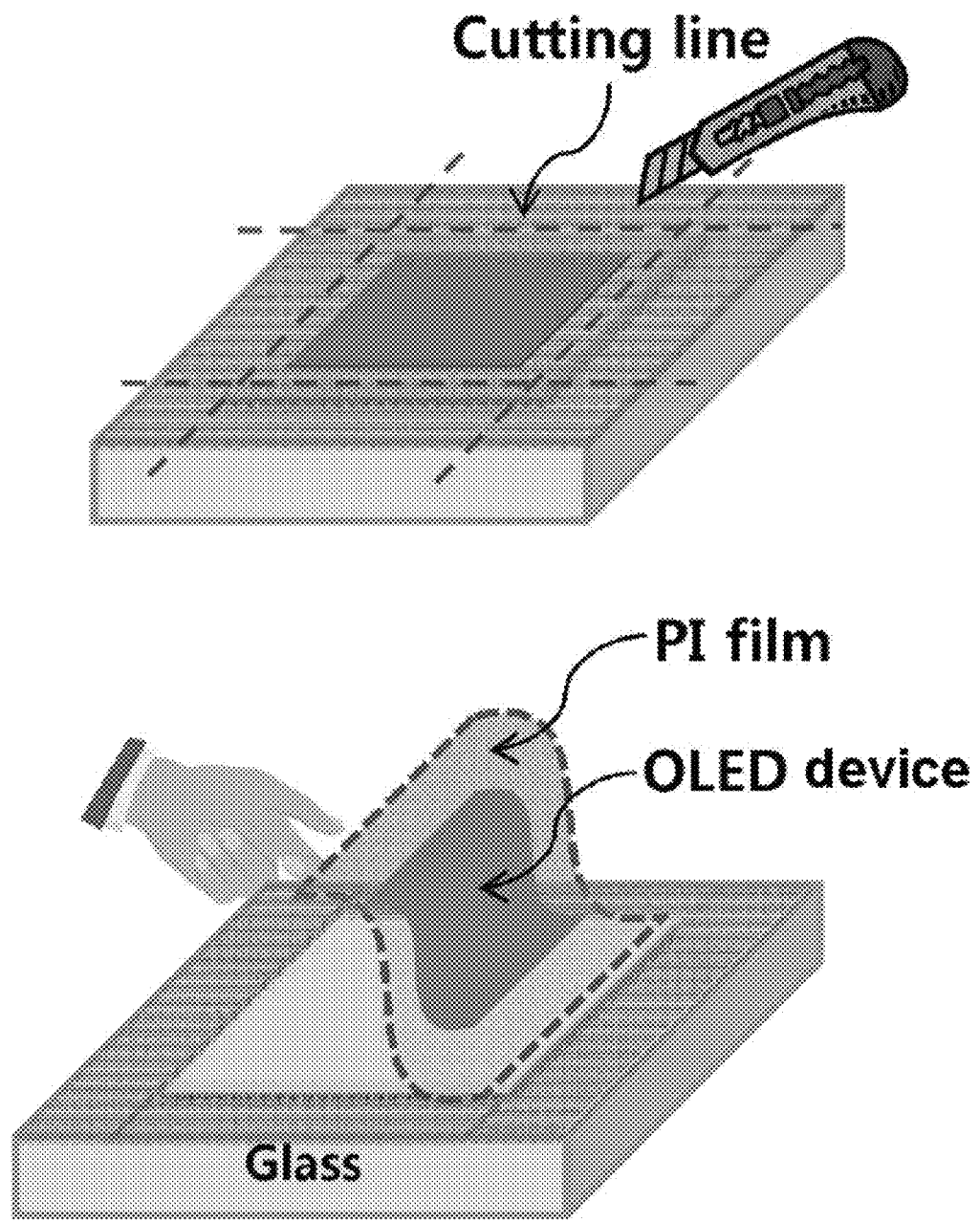

ORGANIC LIGHT EMITTING DEVICE COMPRISING FLEXIBLE SUBSTRATE AND METHOD FOR PREPARING THEREOF

TECHNICAL FIELD

This application is a National Stage Entry of International Application No. PCT/KR2013/010398, filed Nov. 15, 2013, and claims the benefit of Korean Application No. 10-2012-0138336, filed on Nov. 30, 2012, all of which are hereby incorporated herein by reference in their entirety The present application relates to an organic light emitting device including a flexible substrate and a preparing method thereof.

BACKGROUND ART

An organic light emitting device is formed by two opposing electrodes and organic material thin films having a plurality of layers having semiconductor-like properties interposed therebetween. The organic light emitting device having the aforementioned configuration uses a phenomenon in which electric energy is converted into light energy by using an organic material, that is, an organic light emitting phenomenon. Specifically, when voltage is applied between two electrodes in a structure in which an organic material layer is disposed between an anode and a cathode, holes from the anode and electrons from the cathode are injected into the organic material layer. When the injected holes and electrons meet each other, an exciton is formed, and the exciton falls down to a bottom state again to emit light.

In the aforementioned organic light emitting device, light generated from the organic material layer is emitted through a light-transmitting electrode, and the organic light emitting device may be typically classified into a top emission type, a bottom-emission type, and a dual emission type. In the case of the top emission or bottom emission type, one of two electrodes needs to be a light transmitting electrode, and in the case of the dual emission type, all the two electrodes need to be light transmitting electrodes.

In respect to the aforementioned organic light emitting device, many studies have been concentrated since Kodak Co., Ltd. announced that when a multilayer structure is used, the element may be driven at low voltage, and recently, a natural color display using the organic light emitting device is attached to a mobile phone and commercialized.

Further, as recent studies on the organic light emitting device using a phosphorescent material instead of an existing fluorescent material have been conducted, efficiency has been rapidly improved, and it is also expected that the element would be able to replace a known lighting in the near future.

In order to use the organic light emitting device as lighting, the element needs to be driven at high brightness unlike the existing natural color display, and constant brightness needs to be maintained like the existing lighting. In order to sufficiently improve the brightness of the organic light emitting device, light emission needs to be implemented in a large area, and in order to implement light emission in the large area, a high driving current needs to be used. In addition, in order to maintain the constant brightness in the large area, the aforementioned high current needs to be uniformly injected into the device having the large area.

DETAILED DESCRIPTION OF THE INVENTION

Technical Problem

It is necessary to conduct researches on an organic light emitting device, of which process costs may be reduced by simplifying a preparing process, and which includes a substrate having a flexible property in this art.

Technical Solution

Accordingly, the present application provides a method of preparing a flexible organic light emitting device, including: 1) forming a polyimide layer on a carrier substrate; 2) forming a plastic substrate on the carrier substrate and the polyimide layer; 3) forming an organic light emitting device on the plastic substrate; and 4) separating the carrier substrate.

Further, the present application provides a flexible organic light emitting device manufactured by the method of preparing the organic light emitting device.

Further, the present application provides a flexible organic light emitting device, including: a polyimide layer; a plastic substrate formed on the polyimide layer; and an organic light emitting device formed on the plastic substrate.

Further, the present application provides a flexible organic light emitting device, including: a plastic substrate; and an organic light emitting device formed on the plastic substrate, in which a silane coupling agent is included in at least one portion of a lower surface of the plastic substrate.

Further, the present application provides a display device including the flexible organic light emitting device.

Further, the present application provides a lighting device including the flexible organic light emitting device.

Advantageous Effects

According to the present application, it is possible to provide the organic light emitting device, of which process costs may be reduced by simplifying a preparing process, and which includes a substrate having a flexible property.

Further, according to the present application, the process of preparing the organic light emitting device on the plastic substrate is the same as the process of preparing the organic light emitting device on the glass substrate, so that it is possible to apply the existing process as it is, and the plastic substrate is freely detachable.

BRIEF DESCRIPTION OF DRAWINGS

FIG. 1 is a diagram schematically illustrating a method of laminating a plastic substrate on a polyimide layer as an exemplary embodiment of the present application.

FIG. 2 is a diagram schematically illustrating a cross section of an organic light emitting device formed on the plastic substrate as an exemplary embodiment of the present application.

FIG. 3 is a diagram schematically illustrating a method of separating a carrier substrate as an exemplary embodiment of the present application.

BEST MODE

Hereinafter, the present application will be described in detail.

Lightness and compactness of a product have recently become significant in a display field, but a currently used glass substrate is disadvantageously heavy, easily fragile, and difficult in a continuous process. Accordingly, researches on application of a plastic substrate, which is light, flexible, and available for a continuous process, instead of the glass substrate, to a mobile phone, a notebook computer, and a PDA, and the like have been actively conducted.

Polyimide has an advantage in that synthesis thereof is easy, is usable for fabricating a thin film, and does not require a bridge group for hardening. Recently, according to lightness and precision of an electronic product, polyimide is widely applied to a semiconductor material, such as an LCD, a PDP, and an OLED, as an integration material. Further, many researches for using polyimide to a light and flexible plastic display substrate have been conducted, complementing disadvantages of heaviness and fragility of a glass substrate which has been used in a display field.

In the related art, an organic light emitting device including a polyimide film requires a process of forming a polyimide film on a glass substrate, forming an organic light emitting device on the polyimide film, and then separating the organic light emitting device including the polyimide film from the glass substrate. In this case, a detaching technique of separating the organic light emitting device including the polyimide film from the glass substrate without a modification is significant.

In general, since the polyimide film formed on the glass substrate has poor adhesion, a surface treatment with a silane coupling agent, corona, plasma, and the like needs to be performed on the glass substrate in order to enhance adhesion between the glass substrate and the polyimide film. However, there may be a problem in that it is difficult to separate the polyimide film formed on the surface-treated glass substrate later. Accordingly, in the related art, a sacrificial layer is formed under the polyimide film, or the polyimide film is separated by irradiating laser, UV, or the like.

Further, Japanese Patent Application Laid-Open No. 2011-142168 discloses a method of manufacturing an electronic device, including: adding an adhesive only on a peripheral region of a region of a non-flexible substrate onto which a flexible film is attached; attaching the flexible film onto the non-flexible substrate and forming a device on the flexible film; and cutting the flexible film on which the device is formed, and peeling off the flexible film from the non-flexible substrate. However, in a case where the adhesive is added only on the peripheral region of the region of the non-flexible substrate onto which the flexible film is attached, a warp phenomenon may be generated along a vacant space formed between the non-flexible substrate and the flexible film, and thus it is difficult to form a large area organic light emitting device.

Accordingly, the purpose of the present application is to provide a method of preparing an organic light emitting device, by which it is possible to decrease process costs by simplifying a preparing process, it is possible to manufacture the organic light emitting device having a large area, and the organic light emitting device may include a substrate having a flexible property.

A method of preparing a flexible organic light emitting device according to an exemplary embodiment of the present application includes: 1) forming a polyimide layer on a carrier substrate; 2) forming a plastic substrate on the carrier substrate and the polyimide layer; 3) forming the organic light emitting device on the plastic substrate; and 4) separating the carrier substrate.

In the present application, step 1) is a step of forming the polyimide layer on the carrier substrate. The material known in the art may be used as the carrier substrate. More particularly, a glass substrate, a metal substrate, a plastic substrate, and the like may be used as the carrier substrate, but the carrier substrate is not limited thereto.

The thickness of the carrier substrate may be from 0.5 mm to 0.7 mm, but is not limited thereto.

The polyimide layer may be formed by using a method known in the art. More particularly, the polyimide layer may be formed by a process of laminating a polyimide film on a carrier substrate, and may be formed by coating a polyamic acid composition on a carrier substrate and hardening the polyamic acid composition. Further, the polyimide layer may be formed by screen-printing polyimide, but is not limited thereto.

The polyimide layer has excellent chemical resistance and heat resistance, so that the polyimide layer may be advantageous for a photo process performed when the organic light emitting device is manufactured later.

Step 1) may additionally include a step of patterning the polyimide layer. That is, the polyimide layer may be formed only on a region of the carrier substrate on which the organic light emitting device is formed later.

In the present application, step 2) is a step of forming the plastic substrate on the carrier substrate and the polyimide layer.

The method may further include a step of adding adhesion between the carrier substrate and the plastic substrate, and between the polyimide layer and the plastic substrate of step 2). In the step of adding the adhesion, a silane coupling agent surface treatment method, a corona surface treatment method, or a plasma surface treatment method may be used on the carrier substrate and the polyimide layer. The surface treatment may be performed on an entire upper portion of the carrier substrate and the polyimide layer. The purpose of the surface treatment is to enhance adhesion between the carrier substrate and the plastic substrate.

The plastic substrate may be selected from the group consisting of polyethylene terephthalate (PET), polyester, polycarbonate (PC), polyimide (PI), polyethylene naphthalate (PEN), polyether ether ketone (PEEK), polyarylate (PAR), polycyclicolefin (PCO), polynorbornene, polyethersulphone (PES), and cycloolefin polymer (COP), but is not limited thereto.

More particularly, step 2) may be performed by a process of laminating the plastic substrate on the carrier substrate and the polyimide layer.

Further, step 2) may be performed by a process of coating the polyamic acid composition on the carrier substrate and the polyimide layer and hardening the polyamic acid composition to form a polyimide film.

FIG. 1 schematically illustrates a method of laminating the polyimide film on photosensitive polyimide below.

The plastic substrate may have a larger area than that of the polyimide layer. Further, the plastic substrate may have the same area as that of the glass substrate, but is not limited thereto. In a region of a lower portion of the plastic substrate having no polyimide layer, the plastic substrate may be directly and strongly attached to the surface treated carrier substrate, and the plastic substrate may be relatively weakly attached to the surface treated polyimide layer. The plastic substrate and the surface treated polyimide layer are relatively weakly attached to each other, so that it is possible to easily separate the carrier substrate, the polyimide layer, and the like later. Particularly, a region of an edge region, which corresponds to a border region of the carrier substrate, having a width of 5 to 10 mm may be strongly attached with the surface treated carrier substrate and the plastic substrate.

Further, in the region of the lower portion of the plastic substrate having no polyimide layer, the plastic substrate may be directly and strongly attached to the surface treated carrier substrate, so that it is possible to sufficiently endure a photo process, a depositing process, and the like performed when the organic light emitting device is formed later, and an adhesive property may be maintained even at a high temperature of 250° C. or higher.

In the present application, step 3) is a step of forming the organic light emitting device on the plastic substrate. The organic light emitting device may include an anode, one or more organic material layer, and a cathode.

The anode may be formed of one or more selected from magnesium, calcium, sodium, potassium, titanium, indium, yttrium, lithium, gadolinium, aluminum, platinum, gold, tungsten, tantalum, copper, silver, tin and lead.

In addition, the anode may also be formed of a transparent conductive oxide. Here, the transparent conductive oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al) and lanthanum (La).

The anode may be formed by using any one physical vapor deposition (PVD) selected from sputtering, E-beam evaporation, thermal evaporation, laser molecular beam epitaxy (L-MBE) and pulsed laser deposition (PLD); any one chemical vapor deposition selected from thermal chemical vapor deposition, plasma-enhanced chemical vapor deposition (PECVD), light chemical vapor deposition, laser chemical vapor deposition, metal-organic chemical vapor deposition (MOCVD) and hydride vapor phase epitaxy (HYPE); or atomic layer deposition (ALD).

An auxiliary electrode may be additionally included in order to improve the resistance of the anode. The auxiliary electrode may be formed of one or more selected from the group consisting of conducting sealants and metals through a depositing process or a printing process. More particularly, the auxiliary electrode may include Cr, Mo, Al, Cu, an alloy thereof and the like, but is not limited thereto.

An insulating layer may be additionally included on the auxiliary electrode. The insulating layer may be formed by using a material and a method known in the art. More particularly, the insulating layer may be formed by using a general photoresist material; polyimide; polyacryl; silicon nitride; silicon oxide; aluminum oxide; aluminum nitride; alkali metal oxide; alkaline earth metal oxide, and the like, but is not limited thereto. A thickness of the insulating layer may be from 10 nm to 10 μm, but is not limited thereto.

Specific materials and formation methods for the organic material layer are not particularly limited, and materials and formation methods widely known in the art may be used.

The organic material layer may be manufactured with fewer layers by using various polymer materials by a solvent process, for example, a spin coating method, a dip coating method, a doctor blading method, a screen printing method, an inkjet printing method, a thermal transfer method, or the like, other than a deposition method.

The organic material layer may have a laminate structure that includes a light emitting layer, and includes one or more selected from a hole injection layer, a hole transport layer, an electron transport layer, and an electron injection layer.

As a material capable of forming the hole injection layer, a material having a large work function is generally preferred such that the injection of holes into the organic material layer may be facilitated. Specific examples of the hole injection material include a metal, such as vanadium, chromium, copper, zinc and gold, or alloys thereof; a metal oxide, such as zinc oxide, indium oxide, indium tin oxide (ITO) and indium zinc oxide (IZO); a combination of metal and oxide, such as ZnO:Al or SnO2:Sb; an electrically conductive polymer, such as poly(3-methylthiophene), poly [3,4-(ethylene-1,2-dioxy)thiophene] (PEDT), polypyrrole and polyaniline, and the like, but are not limited thereto.

As a material capable of forming the electron injection layer, a material having a small work function is generally preferred such that electrons are easily injected into the organic material layer. Specific examples of the electron injection material include a metal, such as magnesium, calcium, sodium, potassium, titanium, indium, yttrium, lithium, gadolinium, aluminum, silver, tin and lead, or alloys thereof; a multi-layered material, such as LiF/Al or LiO2/Al, and the like, and the same material as that of the hole injection electrode may be used as the electron injection material, but the electron injection material is not limited thereto.

As a material capable of forming the light emitting layer, a material that is capable of emitting light in a visible ray region by receiving holes from the hole transport layer and electrons from the electron transport layer, respectively, and combining the holes and the electrons, and a material having high quantum efficiency for fluorescence or phosphorescence is preferable. Specific examples thereof include 8-hydroxy-quinoline-aluminum complex (Alq3); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene) (PPV)-based polymers; spiro compounds; polyfluorene and rubrene; phosphorescence host CBP[[4,4'-bis(9-carbazolyl)biphenyl] and the like, but are not limited thereto.

Further, the light emitting material may additionally include a phosphorescent dopant or fluorescent dopant in order to improve fluorescent or phosphorescent characteristics. Specific examples of the phosphorescent dopant include ir(ppy)(3) [fac tris(2-phenylpyridine) iridium], F2Irpic [iridium(III)bis(4,6,-di-fluorophenyl-pyridinato-N,C2) picolinate] or the like. As the fluorescent dopant, those known in the art may be used.

As a material capable of forming the electron transport layer, a material capable of receiving electrons from the electron injection layer well and transporting the electrons to the light emitting layer, and having high mobility to electrons is suitable. Specific examples thereof include Al complexes of 8-hydroxyquinoline; complexes including Alq3; organic radical compounds; hydroxyflavone-metal complexes; and the like, but are not limited thereto.

The cathode may include at least one of Al, Ag, Ca, Mg, Au, Mo, Ir, Cr, Ti, Pd, and an alloy thereof, but is not limited thereto.

FIG. 2 schematically illustrates a cross section of the organic light emitting device formed on the plastic substrate.

In the present application, a step of encapsulating the organic light emitting device may be additionally included after step 3). The purpose of the encapsulation is to prevent foreign substances, such as oxygen and moisture, from permeating into the organic light emitting device, and may be performed by using a material, a method, and the like known in the art.

The encapsulation process may be performed by forming a sealing part covering an external side of the organic light emitting device.

If the sealing part may seal the organic light emitting device while covering the external side of the organic light emitting device, a material thereof is not particularly limited. For example, the sealing part may be formed by compressing the external side of the organic light emitting device with a sealing film, or depositing a metal or a metal oxide, or may be formed by coating and hardening a resin composition.

Further, the sealing part may be formed by depositing a metal or a metal oxide by an atomic layer deposition method. Here, the formed metal layer or metal oxide layer may be a structure having two or more layers.

In the present application, step 4) is a step of separating the carrier substrate.

In the related art, it is difficult to separate a polyimide film formed on a surface treated carrier substrate, so that a sacrificial layer is formed under the polyimide film, or the polyimide film is separated by irradiating laser, UV, or the like. However, in the present application, in the region of the lower portion of the plastic substrate having no polyimide layer, the plastic substrate is directly and strongly attached to the surface treated carrier substrate, and the plastic substrate is relatively weakly attached to the surface treated polyimide layer by using the patterned polyimide layer, so that it is possible to easily separate the carrier substrate, the polyimide layer, and the like. A specific separation method may include a method of separating the carrier substrate, the polyimide layer, and the like by using a knife, laser, and the like, but is not limited thereto.

FIG. 3 schematically illustrates a method of separating the carrier substrate below.

Further, the present application provides an organic light emitting device manufactured by the method of preparing the organic light emitting device.

Further, a flexible organic light emitting device according to an exemplary embodiment of the present application includes: a polyimide layer; a plastic substrate formed on the polyimide layer; and an organic light emitting device formed on the plastic substrate.

In the present application, a silane coupling agent may be additionally included at least one portion between the polyimide layer and the plastic substrate. The silane coupling agent may serve to improve adhesion between the polyimide layer and the plastic substrate.

Further, a flexible organic light emitting device according to another exemplary embodiment of the present application includes: a plastic substrate; and an organic light emitting device formed on the plastic substrate, and a silane coupling agent is included in at least one portion of a lower surface of the plastic substrate.

In the flexible organic light emitting device according to the present application, contents of the polyimide layer, the plastic substrate, the organic light emitting device, and the like are the same as those in the above description, so that detailed descriptions thereof will be omitted.

The flexible organic light emitting device according to the present application may include a light extraction structure. More particularly, a light extraction layer may be additionally included between the plastic substrate and the organic light emitting device.

If the light extraction layer has a structure capable of inducing light scattering, and improving light extraction efficiency of the organic light emitting device, the light extraction layer is not particularly limited. More particularly, the light extraction layer may have a structure in which scattering particles are dispersed in a binder.

Further, the light extraction layer may be directly formed on a base member by a method, such as spin coating, bar coating, slit coating, and the like, or may be formed by a method of preparing the layer in a film form to be attached onto the base member.

Further, a planarization layer may be additionally included on the light extraction layer.

Further, the present application provides a display device including the organic light emitting device. In the display device, the organic light emitting device may serve as a pixel or a backlight. Those known in the art may be applied to other configurations of the display device.

Further, the present application provides a lighting device including the organic light emitting device. In the lighting device, the organic light emitting device serves as a light emitting part. Those known in the art may be applied to other configurations necessary for the lighting device.

As described above, according to the present application, it is possible to provide the organic light emitting device, of which process costs may be reduced by simplifying a preparing process, and includes a substrate having a flexible property.

The invention claimed is:

1. A method for preparing a flexible organic light emitting device, comprising:
   1) forming and patterning a polyimide layer on a carrier substrate;
   2) surface treating the carrier substrate and the polyimide layer;
   3) forming a plastic substrate on a surface treated polyimide layer to have a wider area than that of the surface treated polyimide layer;
   4) forming an organic light emitting device on the plastic substrate; and
   5) separating the carrier substrate,
   wherein the polyimide layer is a photosensitive polyimide layer, and
   wherein the plastic substrate of step 3) is in contact with both a surface treated carrier substrate and the surface treated polyimide layer.

2. The method of claim 1, wherein the polyimide layer of step 1) is formed on a region of the carrier substrate on which the organic light emitting device is formed.

3. The method of claim 1, wherein the polyimide layer of step 1) is formed by coating and hardening a polyamic acid composition.

4. The method of claim 1, wherein the surface treatment uses a silane coupling agent surface treatment method, a corona surface treatment method, or a plasma surface treatment method on the carrier substrate and the polyimide layer.

5. The method of claim 1, wherein the carrier substrate is a glass substrate, a metal substrate, or a plastic substrate.

6. The method of claim 1, wherein a thickness of the carrier substrate is from 0.5 to 0.7 mm.

7. The method of claim 1, wherein step 3) is performed by a process of laminating the plastic substrate on the carrier substrate and the polyimide layer.

8. The method of claim 1, wherein the plastic substrate is selected from the group consisting of polyethylene terephthalate (PET), polyester, polycarbonate (PC), polyimide (PI), polyethylene naphthalate (PEN), polyether ether ketone (PEEK), polyarylate (PAR), polycyclicolefin (PCO), polynorbornene, polyethersulphone (PES), and cycloolefin polymer (COP).

9. The method of claim 1, wherein the plastic substrate includes a polyimide film, and step 3) is performed by a process of a coating polyamic acid composition on the surface treated carrier substrate and the surface treated polyimide layer and hardening the polyamic acid composition to form a polyimide film.

10. The method of claim 1, wherein the plastic substrate of step 3) has the same area as that of the carrier substrate.

11. The method of claim 1, further comprising:
encapsulating the organic light emitting device after step 4).

12. The method of claim 1, wherein a method of separating the carrier substrate of step 5) uses a knife or laser.

13. The method of claim 1, further comprising:
removing the surface treated polyimide layer simultaneously with or after step 5).

14. A flexible organic light emitting device manufactured by the method for preparing the organic light emitting device, comprising:
   1) forming and patterning a polyimide layer on a carrier substrate;
   2) surface treating the carrier substrate and the polyimide layer;
   3) forming a plastic substrate on a surface treated polyimide layer to have a wider area than that of the surface treated polyimide layer;
   4) forming an organic light emitting device on the plastic substrate; and
   5) separating the carrier substrate,
   wherein the polyimide layer is a photosensitive polyimide layer, and
   wherein the plastic substrate of step 3) is in contact with both a surface treated carrier substrate and the surface treated polyimide layer.

15. The flexible organic light emitting device of claim 14, further comprising:
a silane coupling agent on at least one portion between the polyimide layer and the plastic substrate.

16. The flexible organic light emitting device of claim 14, further comprising:
a light extraction layer between the plastic substrate and the organic light emitting device.

17. The flexible organic light emitting device of claim 16, further comprising:
a planarization layer on the light extraction layer.

18. The flexible organic light emitting device of claim 14, comprising:
   a plastic substrate; and
   an organic light emitting device formed on the plastic substrate,
   wherein a silane coupling agent is included in at least one portion of a lower surface of the plastic substrate.

19. The flexible organic light emitting device of claim 18, further comprising:
a light extraction layer between the plastic substrate and the organic light emitting device.

20. The flexible organic light emitting device of claim 19, further comprising:
a planarization layer on the light extraction layer.

21. A display device comprising the flexible organic light emitting device of claim 14.

22. A lighting device comprising the flexible organic light emitting device of claim 14.

* * * * *